United States Patent [19]

Ueno

[11] Patent Number: 5,214,272
[45] Date of Patent: May 25, 1993

[54] PHOTOELECTRIC CONVERTING APPARATUS

[75] Inventor: Isamu Ueno, Atsugi, Japan

[73] Assignee: Canon Kabushiki Kaisha, Tokyo, Japan

[21] Appl. No.: 738,564

[22] Filed: Jul. 31, 1991

[30] Foreign Application Priority Data

Aug. 2, 1990 [JP] Japan .................................. 2-203967
Jul. 26, 1991 [JP] Japan .................................. 3-208804

[51] Int. Cl.$^5$ .......................................... H01J 40/14
[52] U.S. Cl. ............................ 250/208.1; 250/578.1;
358/213.16; 257/435
[58] Field of Search ................ 250/208.1, 578.1;
357/30 L; 358/213.16; 257/435

[56] References Cited

U.S. PATENT DOCUMENTS 4,293,877 10/1981 Tsunekawa et al. ............. 357/30 X
4,484,223 11/1984 Tsunekawa ..................... 358/213.16
4,672,221 6/1987 Saito et al. ....................... 357/30 X
4,678,938 7/1987 Nakamura ..................... 250/208.1 X
4,879,470 11/1989 Sugawa et al. ..................... 250/578
4,939,592 7/1990 Saika et al. ..................... 250/208.1 X
5,159,186 10/1992 Ohzu ............................... 250/208.1

FOREIGN PATENT DOCUMENTS 38474 10/1981 European Pat. Off. .

OTHER PUBLICATIONS

"A Low-Noise Bi-CMOS Linear Image Sensor with Auto-Focusing Function", IEEE Transactions on Electron Devices, vol. 36, No. 1, pp. 39 and 42.

Primary Examiner—Constantine Hannaher
Assistant Examiner—Edward J. Glick
Attorney, Agent, or Firm—Fitzpatrick, Cella, Harper & Scinto

[57] ABSTRACT

A photoelectric converting apparatus has a plurality of photoelectric converting devices each of which can execute a photoelectric conversion and is constructed so that photo carriers can be accumulated onto a control electrode. At least one of the photoelectric converting devices is covered by a conductive light shielding layer. A transparent electrode is formed on at least the other photoelectric converting devices.

21 Claims, 12 Drawing Sheets

PHOTOELECTRIC CONVERTING APPARATUS

BACKGROUND OF THE INVENTION

1. Field of the Invention

The present invention relates to a photoelectric converting apparatus and, more particularly, to a photoelectric converting apparatus having a plurality of photoelectric converting devices each of which can accumulate photocarriers onto a control electrode and can execute a photoelectric conversion and having at least a part of the photoelectric converting devices.

2. Related Background Art

As a photoelectric converting apparatus, there has been known an apparatus in which a light shielding layer is formed on a plurality of photoelectric converting devices formed on a semiconductor substrate so as to cover at least a part of the photoelectric converting elements and such a photoelectric converting device which has been covered by the light shielding layer is allowed to act as a dark pixel (for instance, U.S. Pat. No. 4,879,470).

A dark output compensation will now be briefly explained hereinbelow. FIG. 1A is a schematic constructional diagram of a conventional photoelectric converting apparatus having a dark output compensating function.

In the diagram, a sensor section 701 comprises: cells $7S_1$ to $7S_n$ of an opening portion to execute a photoelectric conversion; and a cell $7S_d$ of a light shielding portion to obtain a dark reference output.

Signals of the cells are sequentially generated by a scan section 702 and are supplied to a dark output compensation section 703. The dark output compensation section 703 subtracts the dark reference signal component of the cell $7S_d$ from the signals of the cells $7S_1$ to $7S_n$ and generates a resultant output signal.

Since an output of the sensor cell $7S_d$ of the light shielding portion corresponds to a dark current of the sensor cell, by subtracting the dark reference signal component of the cell $7S_d$ from the signals of the cells $7S_1$ to $7S_n$, a noise component by the dark current is eliminated. Consequently, a photoelectric conversion signal which accurately corresponds to incident light can be obtained.

As a dark output compensation section 703, a clamping circuit can be used or a sample and hold circuit to keep the dark reference signal of the cell $7S_d$ and a differential circuit to calculate differences between the dark reference signal and the signals of the cells $7S_1$ to $7S_n$ can be also used.

Explanation will now be made with reference to FIG. 1B which diagrammatically shows one pixel of photoelectric converting devices of the type which accumulates photocarriers onto a control electrode of a semiconductor transistor. Each of the photoelectric converting devices is constructed on a buried layer 26 formed on a semiconductor substrate 27 and comprises epitaxial layers 24, base layers 25, and device separating layers 23. A transparent insulating layer 22 is formed over each of the photoelectric converting devices. Further, the photoelectric converting device which functions as a dark pixel is covered by a metal light shielding layer 21 formed in or on the insulating layer 22.

There is a case where the photoelectric converting device having the light shielding layer which has been provided in correspondence thereto is hereinafter called a dark pixel and the photoelectric converting device to which a photosignal or optical information can enter is called a light pixel.

In the conventional photoelectric converting apparatus as shown in FIG. 1B, there are many cases where the light shielding layer 21 is also used as a power source line of $V_{cc}$ or the like. Therefore, a parasitic capacity is formed between the light shielding layer and the base region and a difference occurs between the base capacities of the dark pixel and the light pixel. Such a phenomenon will be described by using an equivalent circuit (FIG. 2) of a linear sensor in which BASIS (Base Store Image Sensor) are one-dimensionally arranged and a timing chart (FIG. 3) when such a linear sensor operates.

When a clock $\phi_{CR}$ rises at time $t_1$, transistors $M_{41}$ to $M_{4n}$ are simultaneously turned on and all of temporary accumulation capacitors $C_1$ to $C_n$ are reset to VCR. When a clock $\phi_T$ rises at time $t_2$, transistors $M_{31}$ to $M_{3n}$ are turned on, transistors $Q_1$ to $Q_n$ of a sensor section are turned on, and photo-signals accumulated in base capacitors $Cb_1$ to $Cb_n$ are read out to the capacitors $C_1$ to $C_n$, respectively. After that, a clock $\phi_{BR}$ trails at time $t_3$, transistors $M_{11}$ to $M_{1n}$ are turned on, and the bases of the sensor section are reset (complete reset). Further, at time $t_4$, a clock $\phi_{ER}$ rises, transistors $M_{21}$ to $M_{2n}$ are turned on, emitters of the transistors $Q_1$ to $Q_n$ are reset to VER, and the sensor is transiently reset.

After completion of the reading into the temporary accumulation capacitors and resetting of the sensor, the sensor starts the accumulating operation and the accumulated signals are read out of the temporary accumulation capacitors to an output terminal $V_{out}$. That is, when a clock $\phi_{HR}$ rises at time $t_5$ and a transistor $M_6$ is turned on, an output line L is reset. When an output $SR_1$ from a shift register SR rises at time $t_6$, a transistor $M_{51}$ is turned on and the signal is read out of the capacitor $C_1$ to the output line. By repeating such a reading operation only the a number of times equal to the number of pixels, the reading operations are completed.

When considering the nth pixel in the reading operation from the sensor to the temporary accumulation capacitor, assuming that a long enough reading time has been given, an output voltage VE at the emitter terminal of the transistor $Q_n$ is expressed as follows:

$$VE = A \cdot \frac{i_p \cdot t_s}{Cb_n} \tag{1}$$

where,
A: pixel area
$i_p$: photo current density
$t_s$: accumulation time
$Cb_n$: temporary accumulation capacity of the nth pixel
Therefore, as mentioned above, if temporary accumulation capacities Cb of the dark pixel and the light pixel differ, an output of the dark pixel differs from an output in, the dark state., of the light pixel, so that there is there occurs the case where a problem that the output of the dark pixel cannot be used as a black reference.

FIG. 4 shows a photoelectric converting apparatus in which pixels are two-dimensionally arranged. Reference numeral 101 denotes a vertical driving line; 102 a vertical scanning circuit; 103 a vertical signal line; 104 a switch means; 105 a horizontal signal line; 106 a horizontal scanning circuit; 107 buffer means; 108 horizontal signal line resetting means; and 110 a light shielding layer. Even in the photoelectric converting apparatus with the above structure, in the case where dark pixels are arranged like $S_{11}$ to $S_{1n}$, each base capacity of the dark pixels $S_{11}$ to $S_{1n}$ is large and differs from a base capacity of the light pixel, so that the same problem as in the linear sensor occurs.

SUMMARY OF THE INVENTION

The invention is made to solve the problems in the conventional photoelectric converting apparatus as mentioned above, and it is an object of the invention to provide a photoelectric covnerting apparatus in which a light pixel and a dark pixel have equal temporary accumulation capacity and a stable dark pixel output can be obtained as a black reference.

Another object of the invention is to provide a photoelectric converting apparatus having a plurality of photoelectric converting devices each of which can execute a photoelectric conversion and is constructed so that photocarriers can be accumulated onto a control electrode, wherein at least one of the photoelectric converting devices is covered by a conductive light shielding layer and a transparent electrode is formed on at least the other photoelectric converting devices.

DETAILED DESCRIPTION OF THE PREFERRED EMBODIMENTS

The invention intends to provide a photoelectric converting apparatus having photoelectric converting devices in which a light shielding layer made of a conductive material is provided in order to shield the light which enters a photosensitive surface of a pixel which acts as a dark pixel, wherein a transparent electrode having the same or substantially the same shape as that of the light shielding layer is arranged, at a position in front of the photosensitive surface of a pixel which acts as a light pixel. Thus, substantially the same condition with respect to the foregoing parameters which exert an influence on output voltages of the dark pixel and the light pixel is given to the dark and light pixels, so that a stable dark output can be obtained.

Figure 5:
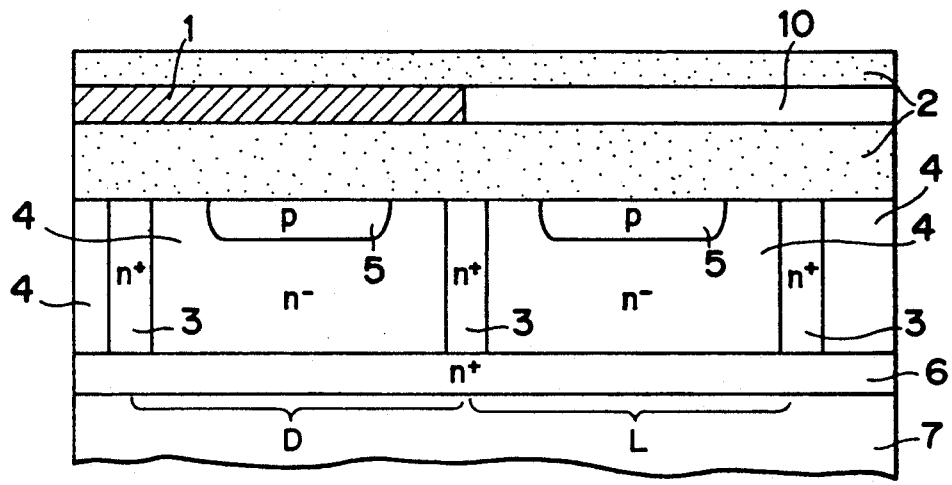
FIG. 5 is a vertical sectional view showing a dark pixel and a light pixel of a photoelectric converting apparatus according to an embodiment of the invention.

An embodiment of the invention will be described hereinbelow with reference to the drawings. FIG. 5 shows one pixel which acts as a dark pixel D and one pixel which acts as a light pixel L in a photoelectric converting apparatus having a plurality of pixels. Reference numeral 1 denotes a light shielding layer; 2 an insulating layer; 3 a device separating region of an $n^+$ semiconductor region; 4 an epitaxial region of an $n^-$ semiconductor region; 5 a base region as a control electrode; 6 a buried layer of the $n^+$ semiconductor region; 7 a semiconductor substrate; and 10 a transparent electrode. The insulating layer 2 is transparent or substantially transparent. The light shielding layer 1 is provided within part of the insulating layer 2 in order to use the pixel covered by the light shielding layer as a dark pixel. The light shielding layer 1 has a large area enough to cover the photo sensitive surface of the photoelectric converting device. The transparent electrode 10 has the same or substantially the same structure as that of the light shielding layer 1 except that the electrode 10 is transparent.

As a material of the transparent electrode 10, it is possible to preferably use at least one material which is selected from the group consisting of indium tin oxide (ITO), indium oxide, tin oxide, zinc oxide, cadmium oxide, cadmium tin oxide, titanium oxide, and Au thin film.

Figure 1A:
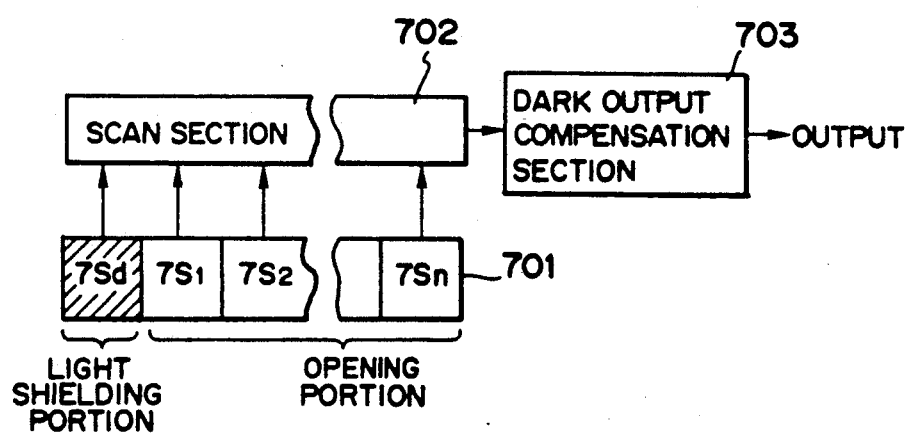
FIG. 1A is a diagrammatical constructional view of a photoelectric converting apparatus for describing a dark output compensation.
Figure 1B:
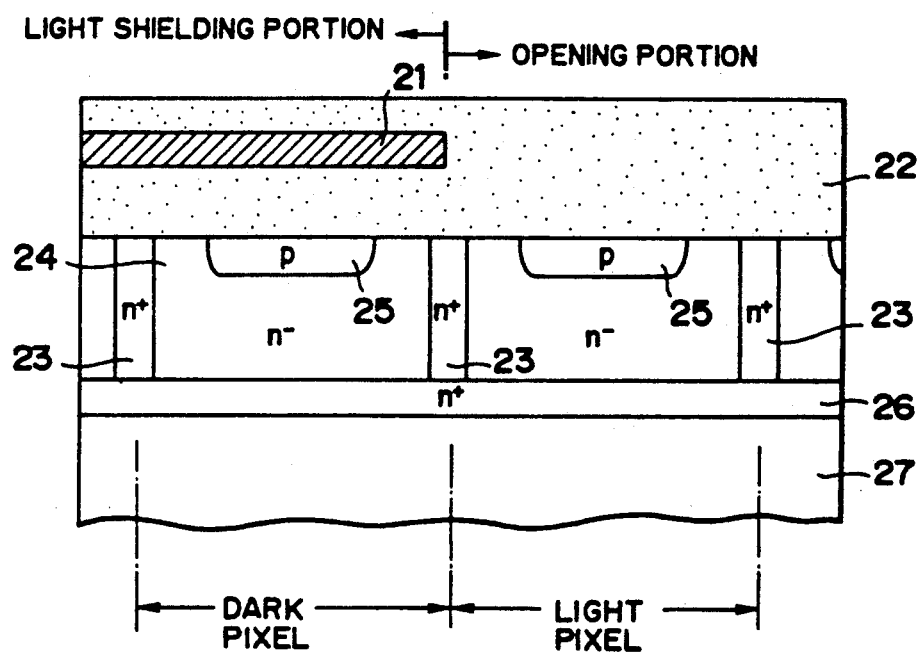
FIG. 1B is a vertical sectional view showing one pixel of each of a dark pixel and a light pixel of a conventional photoelectric converting apparatus.

In the photoelectric converting apparatus constructed as mentioned above, as will be obviously understood by comparing with the conventional photoelectric converting apparatus shown in FIG. 1B, the portion of the dark pixel D and the portion of the light pixel L have substantially electrically the same structure with respect to a point that the conductive layer is located over the base region 5 through the insulating layer 2. Therefore, the parameters in the equation (1) are substantially equal with regard to the portion of the dark pixel D and the portion of the light pixel L. The output of the dark pixel can be used as an accurate black reference.

Figure 6:
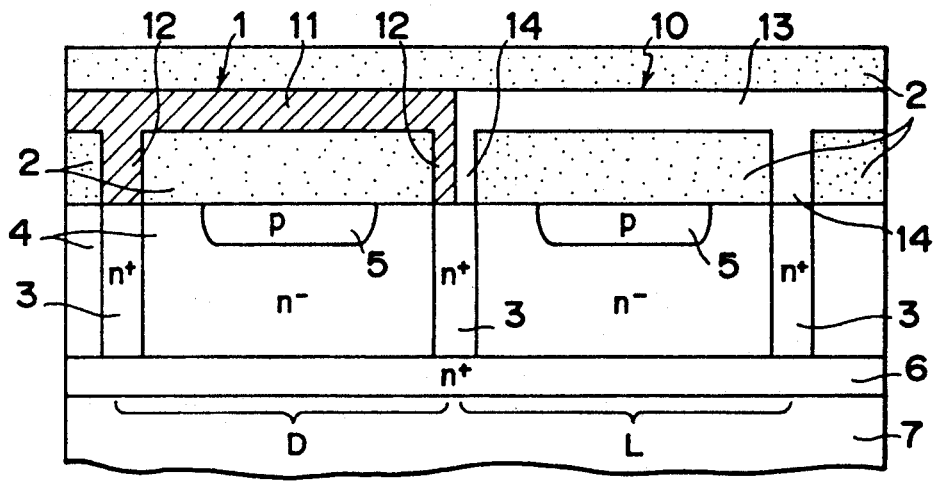
FIGS. 6 and 7 are vertical sectional views showing photoelectric converting apparatuses according to other embodiments of the invention and are diagrams similar to FIG. 5.

FIG. 6 shows another embodiment of the invention. In this embodiment, the light shielding layer 1 has: a first portion 11 having a large area enough to cover the photosensitive surface of the pixel; and a second portion 12 which extends downward from an edge portion of the first portion 11. The first portion 11 extends along the surface of the insulating layer 2. The second portion 12 penetrates the insulating layer 2 in the thickness direction and reaches the surface of the device separating region 3. Similarly, the transparent electrode 10 has a first portion 13 and a second portion 14 which extends downward from an edge portion of the first portion 13. According to this embodiment, the upper region of the photosensitive surface of the pixel which acts as a dark pixel is covered by the first portion 11 at an upper position and is covered by the second portion 12 at a side position, respectively. Therefore, the light which has entered the sensor surface perpendicularly, or at an angle near a right angle, is almost completely shielded by the first portion 11 of the light shielding layer 1. The light which has obliquely entered the sensor surface is shielded by the second portion 12 which starts from the edge portion 12 of the first portion 11 and reaches the surface of the device separating region 3. By using the above structure, a situation such that the light unexpectedly enters the photo sensitive surface is eliminated and the pixel covered by the light shielding layer can be allowed to further stably function as a dark pixel.

Figure 7:
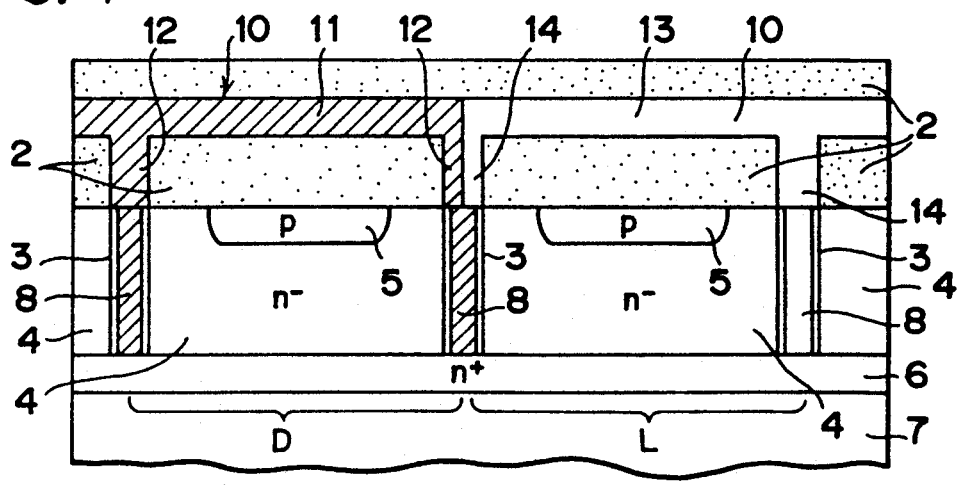

FIG. 7 shows another embodiment of the invention. A photoelectric converting apparatus of this embodiment has a structure such that a light shielding layer 8 locating in the device separating region 3 is further provided for the photoelectric converting apparatus shown in FIG. 6. According to the above construction, a sufficient light shielding effect is presented for not only the light which enters the insulating layer 2 from the side direction but also the light which enters the insulating layer 2 from the side direction of the epitaxial layer 4, and so a further high performance can be obtained as a dark pixel.

Figure 2:
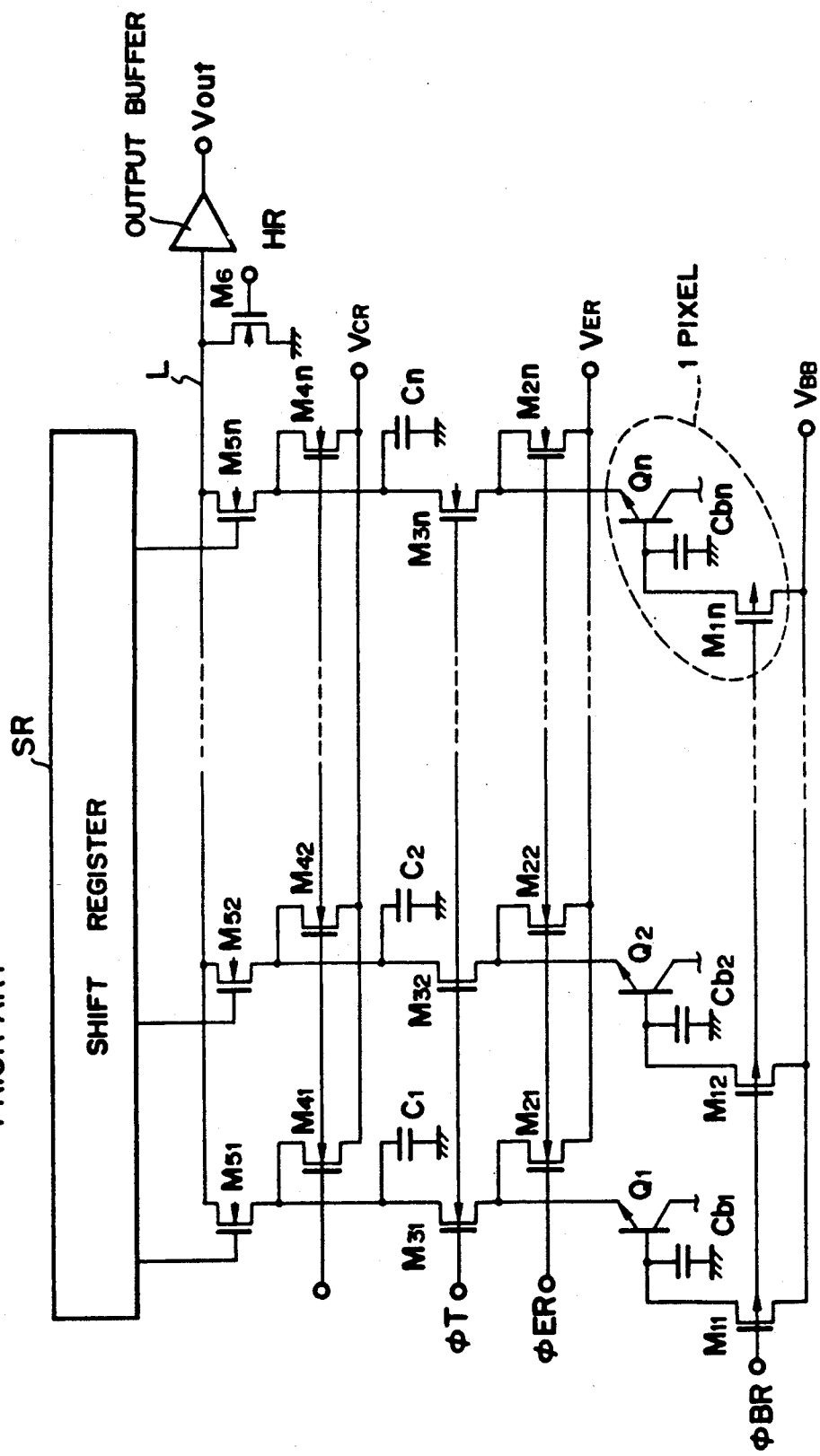
FIG. 2 is an equivalent circuit diagram of a linear sensor in which photoelectric converting apparatuses of FIG. 1B are arranged like a plane.
Figure 3:
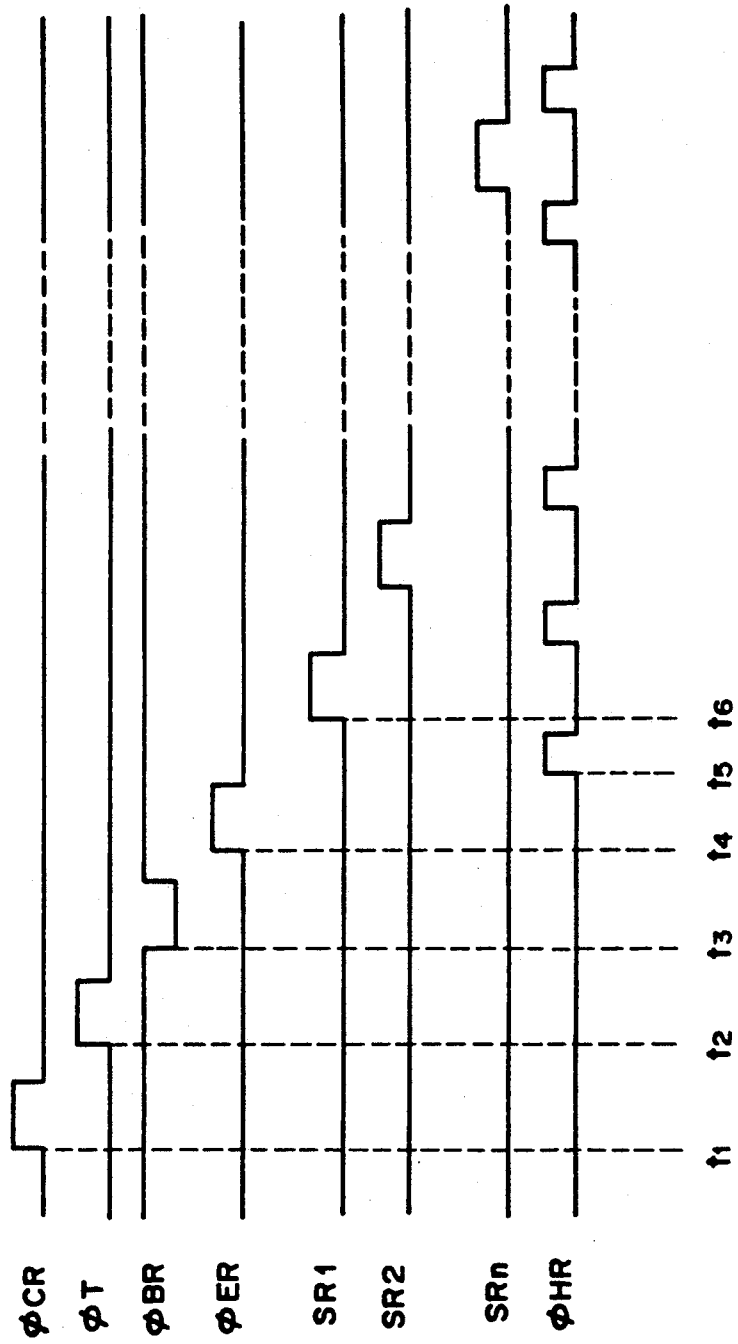
FIG. 3 is an operation timing chart of the circuit of FIG. 2.
Figure 4:
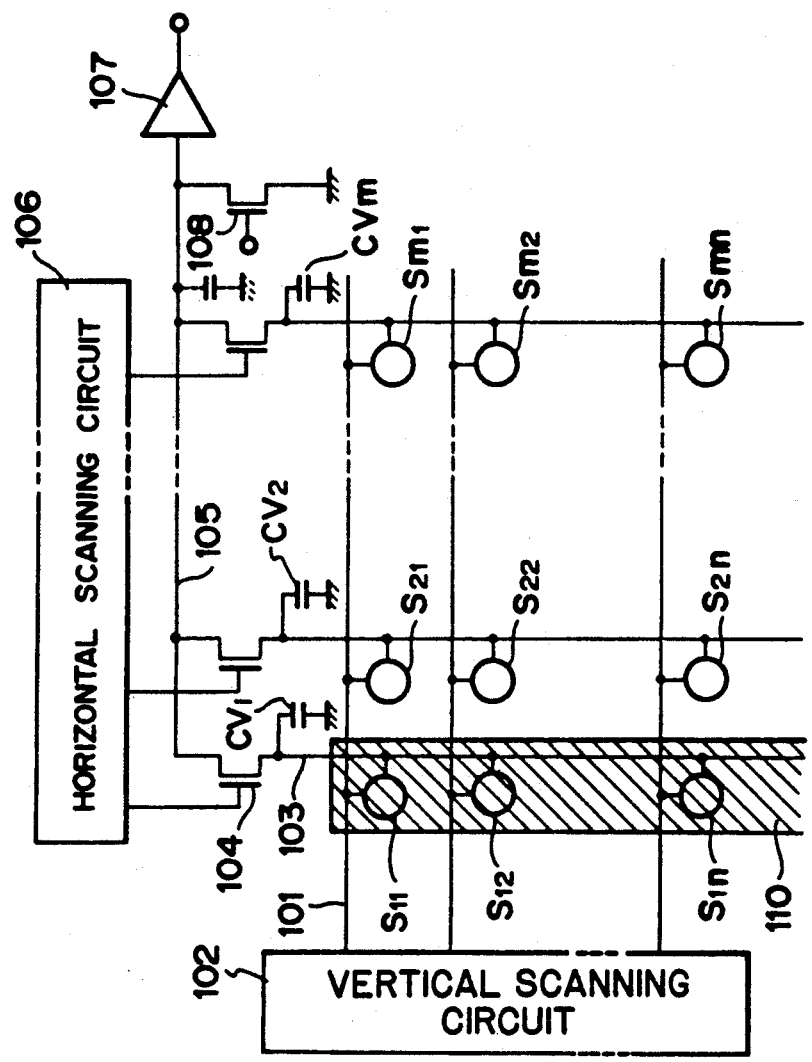
FIG. 4 is an equivalent circuit diagram of a sensor in which pixels are two-dimensionally arranged.
Figure 8A:
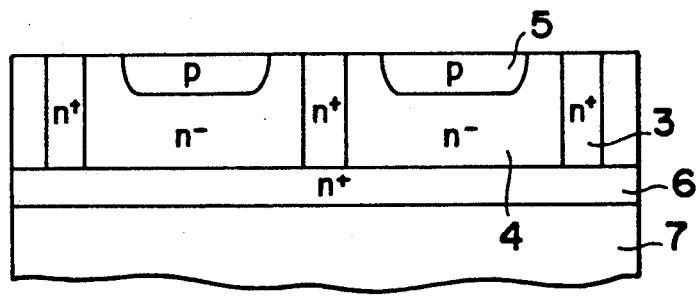
FIGS. 8A to 8F are explanatory diagrams showing steps of manufacturing the photoelectric converting apparatus of FIG. 6.
Figure 8B:
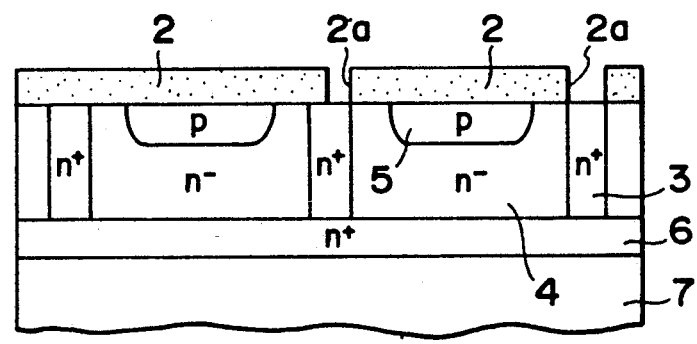
Figure 8C:
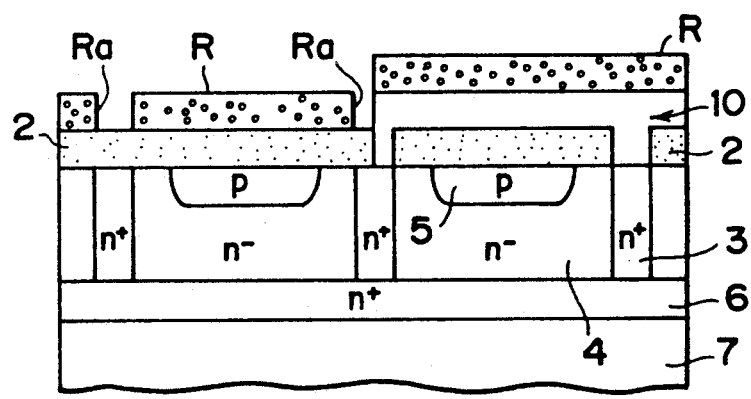
Figure 8D:
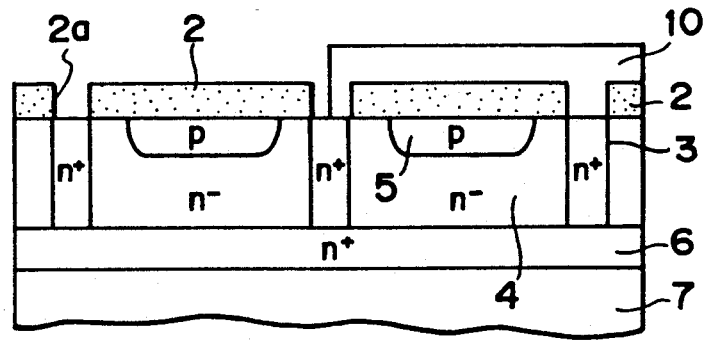
Figure 8E:
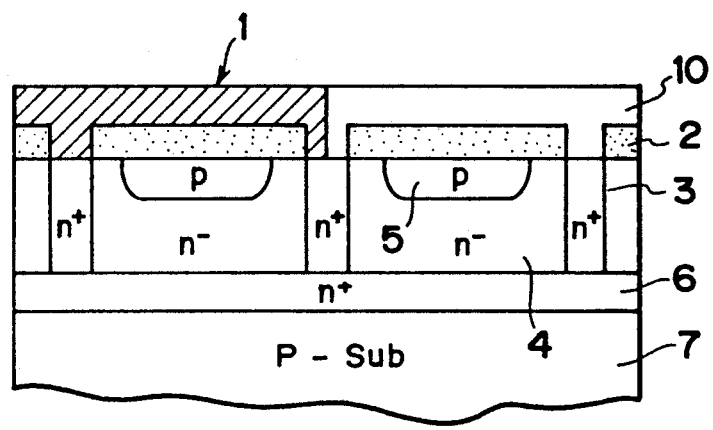
Figure 8F:
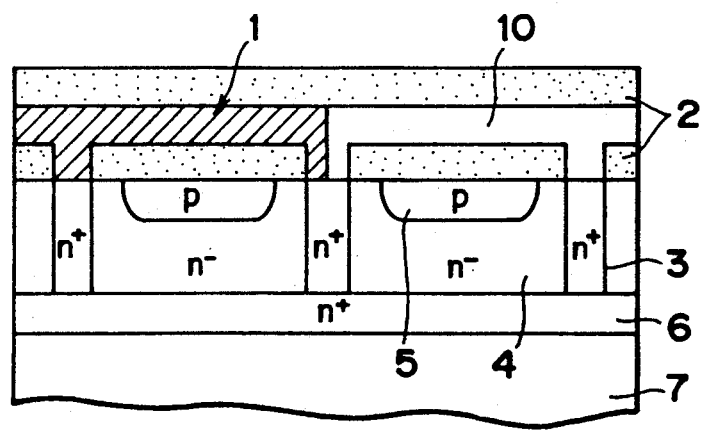

An example of steps of manufacturing the photoelectric converting apparatus having the dark pixel of the structure shown in FIG. 2 will now be described with reference to FIGS. 8A to 8F. First, a device structure shown in FIG. 8A having the n+ type device separating region 3, the n− type epitaxial region 4, the p type base region 5, and the n+ type buried layer 6 is formed on the p type semiconductor substrate 7. The insulating film 2 between layers made of phosphorus glass, SiO$_2$, or the like is deposited onto the epitaxial layer 4 by a CVD method and holes 2a are formed in the inter-layer insulating film 2 by patterning and etching (FIG. B). A conductive film is subsequently formed by an ordinary method. The transparent electrode 10 as shown in FIG. 8C is formed in the region corresponding to the light pixel by patterning. Further, a resist film R is coated onto the transparent electrode 10 and the insulating film 2. After that, a patterning is executed so as to form holes R$_a$ in accordance with a predetermined pattern. Subsequently, the insulating film 2 is etched and eliminated in the portions of the holes R$_a$. Thus, contact holes 2a as shown in FIG. 8D are formed. After that, a conductive material having a light shielding performance is evaporation deposited onto portions of desired regions excluding the portion where the transparent electrode 10 has been formed, thereby forming the light shielding layer 1 shown in FIG. 8E. The light shielding layer 1 can be formed by using an Al-CVD method, which will be explained hereinlater. Finally, the insulating layer 2 as a passivation film is formed onto the light shielding layer 1 and the transparent electrode 10 by the CVD method (FIG. 8F).

The Al-CVD method which is applied to the manufacturing of the photoelectric converting apparatus according to the embodiment of the invention will now be described.

Film forming method

This method is suitable to bury a metal material into fine deep holes (contact hole, through hole concave portion) in which, for instance, an aspect ratio is equal to 1 or more and has an excellent selectivity. The metal film formed by the above method has an extremely excellent crystalline performance such that a monocrystalline aluminum is formed and the metal film hardly contains carbon and the like.

Similarly, the above metal has a low resistivity within a range from 0.7 to 3.4 $\mu\Omega$·cm and a high reflectance within a range from 85 to 95% and has an excellent surface performance such that a density of hillocks of 1 $\mu$m or more lies within a range from about 1 to 100 cm$^{-2}$.

With respect to a generation probability of alloy spikes at the interface with silicon as well, a breakdown probability of a semiconductor junction of 0.15 $\mu$m is almost equal to 0.

According to the Al-CVD method, a deposition film is formed onto an electron donative substrate by a surface reaction by using a gas of alkyl aluminum hydride and a hydrogen gas. Particularly, monomethyl aluminum hydride (MMAH) or dimethyl aluminum hydride (DMAH) is used as a raw material gas and a H$_2$ gas is used as a reaction gas and the surface of the substrate is heated in the above mixture of gases, so that an Al film of a good quality can be deposited.

When an Al film is selectively deposited, it is desirable to keep the surface temperature of the substrate by direct or indirect heating to a value which is equal to or higher than a decomposition temperature of alkyl aluminum halide and lower than 450° C. More preferably, it is desirable to keep the surface temperature within a range from 260° C. to 440° C.

As a method of heating the substrate within the above temperature range, the direct heating method and the indirect heating method are known. Particularly, by holding the substrate to the above temperature by the direct heating method, an Al film of a good quality can be formed at a high deposition speed. For instance, when the substrate surface temperature upon formation of an Al film is set to a more preferable temperature range from 260° C. to 440° C., a film of a good quality is derived at a higher deposition speed than that in the case of using a resistance heating method having a deposition speed of 3000 Å/minute. As such a direct heating method (an energy from the heating means is directly transferred to the substrate and heats the substrate itself), for instance, a lamp heating method using a halogen lamp, a xenon lamp, or the like can be mentioned. On the other hand, as an indirect heating method, there is a resistance heating method and such a method can be realized by using a heat generating element provided for a substrate supporting member arranged in a space to form a deposition film in order to support a substrate on which a deposition film is to be formed.

By applying the CVD method to the substrate on which both of the electron donative surface portion and the non-electron donative surface portion exist by the above method, a monocrystal of Al is formed in only the electron donative substrate surface portion at a good selectivity.

An electron donative material denotes a material such that free electrons exist in the substrate or free electrons have purposely been produced and which has the surface on which a chemical reaction is promoted by transmission and reception of electrons between the substrate and raw material gas molecules adhered on the substrate surface. For instance, generally, metal or semiconductor corresponds to such a material. A material such that a thin oxide film exists on the metal or semiconductor surface can also cause a chemical reaction by the transmission and reception of electrons between the substrate and the adhered raw material molecules, so that the above material is also included in the electron donative materials of the invention.

As practical examples of the electron donative materials, for instance, there can be mentioned a III-V group compound semiconductors of a multi-element system of the binary system, ternary system, or more which are constructed by combining Ga, In, Al, or the like as an element of the III group and P, As, N, or the like as an element of the V group, a semiconductor material such as monocrystalline silicon, amorphous silicon, or the like, or a material which is selected from the following metals, alloys, silicides, and the like: for instance, tungsten, molybdenum, tantalum, copper, titanium, aluminum, titanium aluminum, titanium nitride, aluminum silicon copper, aluminum palladium, tungsten silicide, titanium silicide, aluminum silicide, molybdenumm silicide, tantalum silicide, and the like.

On the other hand, as materials which form the surface on whcih Al or Al-Si is not selectively deposited, namely, as non-electron donative materials, there can be mentioned silicon oxide formed by a thermal oxidation, CVD, or the like, glass such as BSG, PSG, BPSG, or the like, an oxide film, a thermal nitride film, and a silicon nitride film formed by a plasma CVD method, a reduced pressure CVD method, an ECR-CVD method, or the like.

According to the Al-CVD method, the following metal films containing Al as a main component can be also selectively deposited and qualities of such metal films also exhibit excellent characteristics.

For instance, in addition to a gas of alkyl aluminum hydride and hydrogen, a gas containing Si atoms of $SiH_4$, $Si_2H_6$, $Si_3H_8$, $Si(CH_3)$, $SiCl_4$, $SiOH_2CL_2$, $SiHCl_3$, or the like, a gas containing Ti atoms of $TiCl_4$, $TiBr_4$, $Ti(CH_3)_4$, etc., and a gas containing Cu atoms of bisacetyl acetonate copper Cu ($C_5H_7O_2$), bisdipivazoyl methanite copper Cu ($C_{11}H_{19}O_2)_2$, bishexafluoroacetayl acetonate copper Cu ($C_5HF_6O_2)_2$, or the like are properly combined and used as a mixture gas atmosphere. Conductive materials such as Al-Si, Al-Ti, Al-Cu, Al-Si-Ti, Al-Si-Cu, and the like are selectively deposited and an electrode can be also formed.

The above Al-CVD method is a film forming method having an excellent selectivity and the surface performance of the deposited film is good. Therefore, by applying the non-selective film forming method to the next depositing step and by also forming a metal film made of Al or containing Al as a main component onto the above Al film which has selectively been deposited and onto the insulating film of $SiO_2$ and the like, the suitable metal film having a high generality which is suitable as a wiring of the semiconductor apparatus can be obtained.

Practically speaking, the following films can be used as such metal films: that is, a combination of Al, Al-Si, Al-Ti, Al-Cu, Al-Si-Ti, and Al-Si-Cu which have selectively been deposited and Al, Al-Si, Al-Ti, Al-Cu, Al-Si-Ti, and Al-Si-Cu which have nonselectively been deposited; and the like.

As a film forming method for the non-selective deposition, there are a CVD method, a sputtering method, and the like other than the above-mentioned Al-CVD method.

It is also possible to form a wiring in a manner such that a conductive film is formed by a CVD method or a sputtering method and is patterned to thereby form an underlaid layer having a desired wiring shape and, after that, a metal film made of Al or containing Al as a main component is selectively deposited onto the underlayer by using the Al-CVD method. In this manner, a wiring is formed.

Further, a metal film can be also formed onto the insulative film by using the Al-CVD method. For this purpose, a surface quality improving process is executed to the insulative film and substantially the electron donative surface portion is formed. At this time, if a pattern of a desired wiring shape is drawn by using a beam, the metal film is deposited onto only the electron donative portion of the wiring shape which has been drawn by the selective deposition. Thus, a wiring can be formed in a self-aligning manner without patterning.

The manufacturing steps of the photoelectric converting apparatus of the structure of FIG. 6 have been described above. However, it will be obviously understood that the photoelectric converting apparatuses of the structures of FIGS. 5 and 7 can be easily obtained by omitting or changing a part of the above manufacturing steps.

Figure 9:
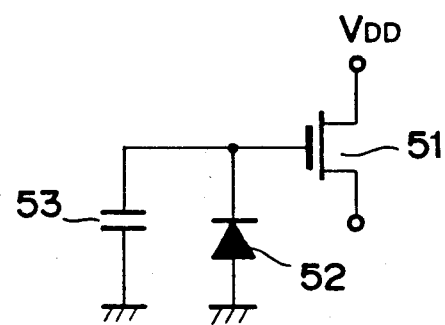
FIGS. 9 to 17 are variously circuit diagrams or sectional views of photoelectric converting apparatuses according to other embodiments of the invention, respectively.
Figure 10:
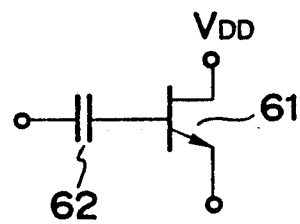

The invention is not limited to the foregoing BASIS sensor but can be also similarly applied to photoelectric converting apparatuses of the type in which photo carriers are accumulated onto the control electrode as shown in, for instance, FIGS. 9 and 10. In FIG. 9, reference numeral 51 denotes an MOS transistor; 52 a photodiode; and 53 an accumulation capacitor. In FIG. 10, reference numeral 61 denotes an SIT and 62 indicates a capacitor.

Another embodiment of the invention will now be described with reference to the drawings.

Figure 11:
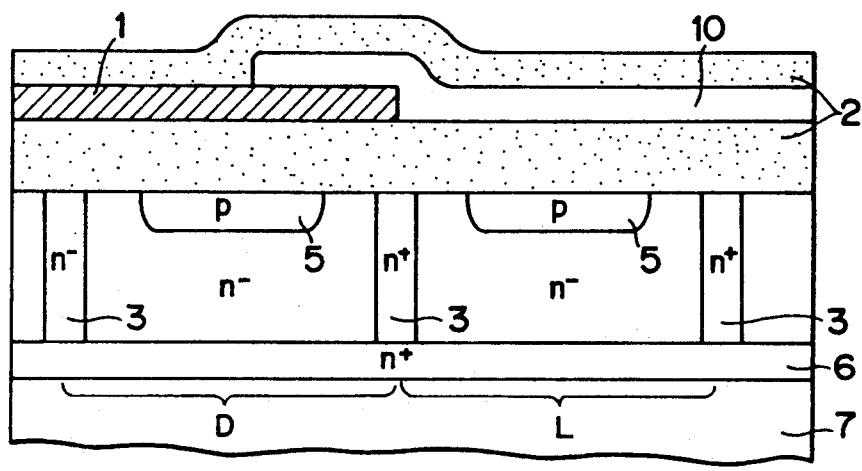

FIG. 11 is a schematic cross-sectional view for explaining another embodiment. There is a difference between this embodiment and the photoelectric converting apparatus which has already been described by reference to FIG. 5. That is, in FIG. 1, the apparatus has a structure such that the light shielding layer 1 and the transparent electrode 10 are come into contact in the boundary region between the dark pixel D and the light pixel L. On the other hand, in this embodiment, the transparent electrode 10 formed over the light pixel L is extended until the region of the dark pixel D.

By constructing the transparent electrode 10 so as to have a shape such that it overlaps the region of the dark pixel D, it is possible to solve the occurrence of the problem such that a necessary position cannot be assured for the transparent electrode 10 because a positional deviation occurs when the transparent electrode 10 is formed.

Although FIG. 11 shows an example in which the light shielding layer 1 and the transparent electrode 10 partially overlap, the transparent electrode 10 can be also extended to a position on the light shielding layer 1 of the regions of a plurality of dark pixels D.

For such an overlap structure, although the transparent electrode 10 has been formed on the light shielding layer 1 in the diagram, the light shielding layer 1 can be also laminated on the transparent electrode 10.

Figure 12:
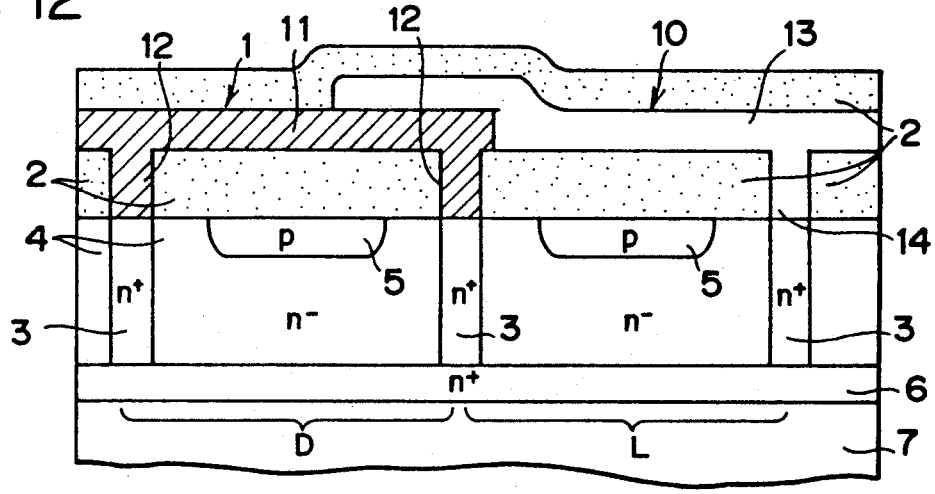
Figure 13:
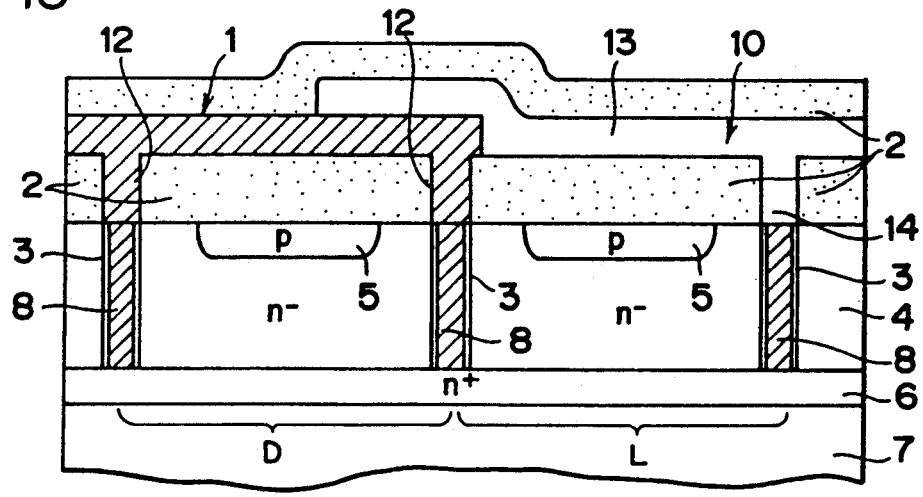

FIGS. 12 and 13 are schematic cross sectional views showing parts of the photoelectric converting apparatuses corresponding to FIGS. 6 and 7, respectively.

FIGS. 12 and 13 also differ from FIGS. 6 and 7 with respect to a point that the light shielding layer 1 and the transparent electrode 10 are overlappingly provided as described in FIG. 12.

FIGS. 12 and 13 also differ from FIGS. 6 and 7 with respect to a point that only the light shielding layer 12 is formed on the device separating region 3 as a boundary region between the light pixel and the dark pixel.

By using such a structure, since the portion on the boundary region is made of a single material, not only the structure is simple but also the photoelectric converting apparatus can be easily manufactured. In addition, since a width of the boundary region can be also narrowed, the above structure is also effective in terms of the space use efficiency and the easiness of the design.

Figure 14:
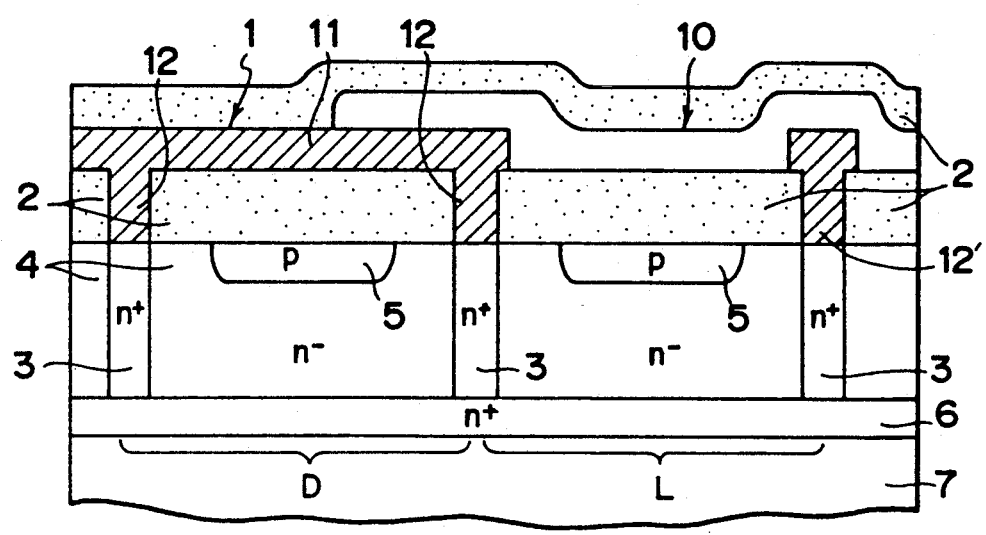
Figure 15:
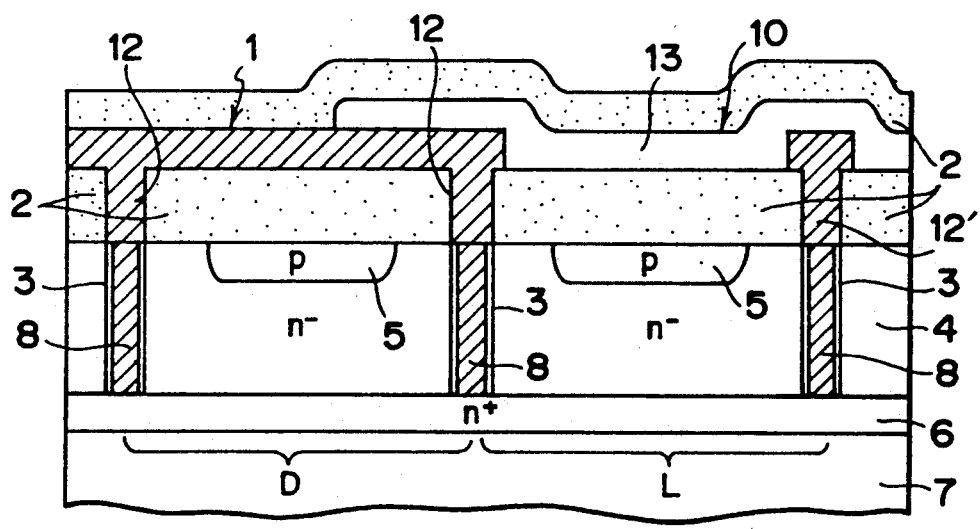

FIGS. 14 and 15 are schematic cross sectional views for explaining further other embodiments of the invention, respectively. The embodiments are modifications corresponding to the photoelectric converting apparatuses shown in FIGS. 12 and 13, respectively.

In FIGS. 14 and 15, a light shielding layer 12' is also formed on the boundary region of the pixel between the light pixels L and the transparent electrode 10 is formed so as to overlap the light shielding layer 12' between the light pixels.

As mentioned above, by also forming the light shielding layer 12' between the light pixels, it is possible to prevent a problem such that in the case where a photosignal or optical information has obliquely entered the photosensitive surface of the photoelectric converting device, the light enters the photo sensitive sections of the surplus photoelectric converting devices.

Thus, in particular, a crosstalk between the light pixels can be reduced and the capacity components of the dark pixel and the light pixel are made coincide, so that the further accurate photoelectric conversion can be accomplished.

Figure 16:
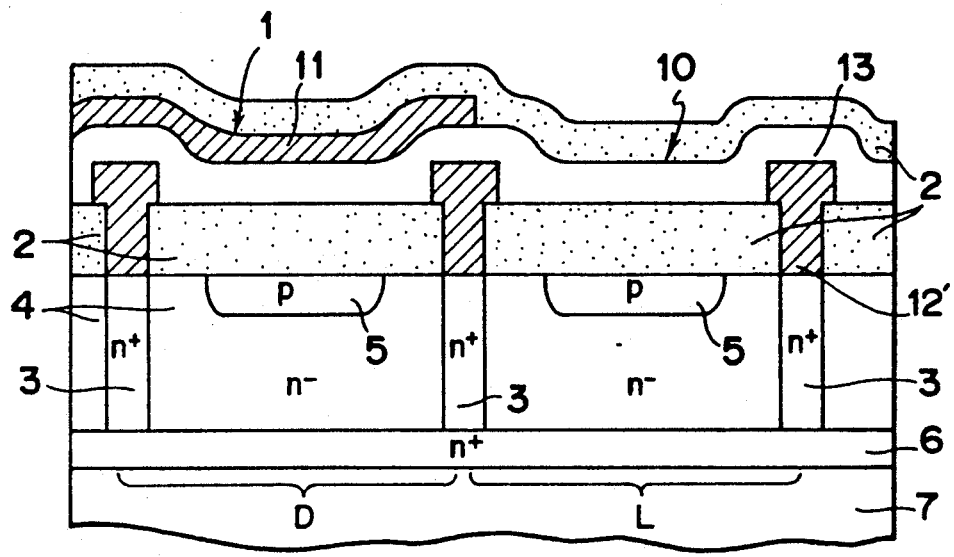
Figure 17:
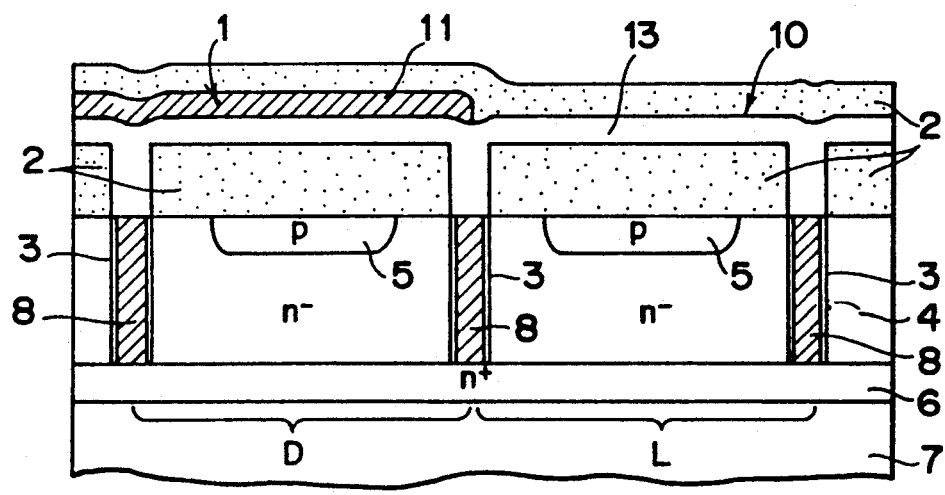

FIGS. 16 and 17 are schematic cross-sectional views for explaining further other embodiments of the invention, respectively.

The embodiments of FIGS. 16 and 17 differ from the foregoing embodiments with respect to a point that the light shielding layer 1 formed on the photoelectric converting device serving as a dark pixel is provided through the transparent electrode 10.

By forming the light shielding layer 1 onto the transparent electrode 10 as mentioned above, the patterning of the transparent electrode 10 becomes unnecessary or easy, so that the yield can be improved and the costs can be reduced.

In order to allow the function of the dark pixel to sufficiently operate, it is effective to form the light shielding layer into the boundary region between the light pixel and the dark pixel as shown in the diagrams. By simultaneously having the light shielding layers 8 and 12' shown in Figs. 16 and 17, the incidence of the light into the photoelectric converting device serving as a dark pixel can be further prevented.

The invention is not limited to the foregoing embodiments but it is possible to combine each of the embodiments within the purview of the spirit of the invention and many variations and modifications are also included in the scope of the appended claims of the invention.

As described above, according to the photoelectric converting apparatuses of the invention, the pixel acting as a light pixel is covered at a front surface thereof by the transparent electrode having the same structure as that of the light shielding layer for a dark pixel. Therefore, the influences of the temporary accumulation capacitors or the like are substantially equal with respect to the light pixel and the dark pixel and the output of the dark pixel can be used as a stable black reference.

What is claimed is:

1. A photoelectric converting apparatus comprising a plurality of photoelectric converting devices each having a respective control electrode and a photoreceiving region responsive to light incident thereon and capable of storing photocarriers produced by the light incident thereon for producing an electric output corresponding to the incident light according to the number of stored photocarriers, wherein a conductive light shielding layer is provided on said photoreceiving region of at least one of said photoelectric conversion devices and spaced by an insulating layer from said photoreceiving region of said at least one said photoelectric conversion devices, and a transparent conductive layer is provided on and spaced by an insulating layer from said photoreceiving region of another of said photoelectric conversion devices.

2. An apparatus according to claim 1, wherein shapes of the light shielding layer and the transparent conductive layer are identical or substantially identical.

3. An apparatus according to claim 1, wherein a boundary region to electrically separate the photoelectric converting devices is formed between the photoelectric converting devices.

4. An apparatus according to claim 3, wherein the light shielding layer is formed on the boundary region.

5. An apparatus according to claim 1, further having a region in which the light shielding layer and the transparent conductive layer are laminated.

6. An apparatus according to claim 1, wherein the transparent conductive layer is formed by at least one material which is selected from the group consisting of indium tin oxide, indium oxide, tin oxide, zinc oxide, cadmium oxide, cadmium tin oxide, titanium oxide, and thin metal film.

7. An apparatus according to claim 1, wherein the light shielding layer is made of Al and/or an Al alloy.

8. An apparatus according to claim 7, wherein said Al alloy is at least one alloy which is selected from the group consisting of Al-Si, Al-Ti, Al-Cu, Al-Si-Ti, and Al-Si-Cu.

9. An apparatus according to claim 1, wherein the control electrode is a base region.

10. A photoelectric conversion apparatus comprising:
a photoelectric conversion device for light pixel, having a control electrode constituted for storing a photocarrier produced by light incident on a photoreceiving section, wherein a transparent electrode is provided on said photoreceiving section of said photoelectric conversion device for light pixel;
a photoelectric conversion device for dark pixel having a control electrode, having the same or substantially the same structure as said photoelectric conversion device for light pixel, wherein a conductive light shielding layer to be used as an electrode covers at least a section of said photoelectric conversion device for dark pixel corresponding to the photoreceiving section of said photoelectric conversion device for light pixel; and
a dark output compensation section for subtracting an output from said photoelectric conversion device for dark pixel from an output from said photoelectric conversion device for light pixel, for producing a photoelectric conversion output.

11. An apparatus according to claim 10, wherein said light shielding layer and said transparent electrode are provided correspondingly to said control electrode.

12. An apparatus according to claim 10, wherein said light shielding layer and said transparent electrode have the same or substantially the same configuration.

13. An apparatus according to claim 10, further comprising a boundary region provided between said photoelectric conversion devices for electrically isolating said photoelectric conversion devices from each other.

14. An apparatus according to claim 13, wherein said light shielding layer is provided on said boundary region.

15. An apparatus according to claim 10, wherein said light shielding layer and said transparent electrode overlap with each other.

16. An apparatus according to claim 10, further comprising an insulating layer provided between said control electrode and said light shielding layer.

17. An apparatus according to claim 10, further comprising an insulating layer provided between said transparent electrode and said control electrode.

18. An apparatus according to claim 10, wherein said transparent electrode is formed of at least one of materials selected from the group consisting of indium tin oxide, indium oxide, tin oxide, zinc oxide, cadmium oxide, cadmium tin oxide, titanium oxide, and thin metal film.

19. An apparatus according to claim 10, wherein said light shielding layer is formed of a material selected from the group consisting of Al or Al alloy.

20. An apparatus according to claim 19, wherein said Al alloy comprising at least one metal selected from the groups consisting of Al-Si, Al-Cu, Al-Si-Ti, and Al-Si-Cu.

21. An apparatus according to claim 10, wherein said control electrode is a base region.

* * * * *